US008311240B2

(12) United States Patent
Inoue et al.

(10) Patent No.: US 8,311,240 B2

(45) Date of Patent: Nov. 13, 2012

(54) AUDIO SIGNAL PROCESSING APPARATUS AND AUDIO SIGNAL PROCESSING METHOD

(75) Inventors: Shinichi Inoue, Saitama (JP); Kazunobu Kubota, Saitama (JP)

(73) Assignee: Sony Corporation, Tokyo (JP)

( * ) Notice: Subject to any disclaimer, the term of this patent is extended or adjusted under 35 U.S.C. 154(b) by 1387 days.

(21) Appl. No.: 11/695,836

(22) Filed: Apr. 3, 2007

(65) Prior Publication Data

US 2007/0288110 A1 Dec. 13, 2007

(30) Foreign Application Priority Data

Apr. 19, 2006 (JP) ................................ 2006-115808

(51) Int. Cl.
*H03G 5/00* (2006.01)

(52) U.S. Cl. ........................................... 381/99; 381/98

(58) Field of Classification Search ................ 381/1, 27, 381/17–22, 98, 99, 87, 300, 303, 104, 77; 700/94; 181/144, 175, 199
See application file for complete search history.

(56) References Cited

U.S. PATENT DOCUMENTS

| | | | | |
|---|---|---|---|---|
| 6,606,388 | B1 * | 8/2003 | Townsend et al. | 381/17 |
| 6,804,361 | B2 * | 10/2004 | Hosoi et al. | 381/99 |
| 7,676,047 | B2 * | 3/2010 | Aylward et al. | 381/97 |
| 2004/0125967 | A1 | 7/2004 | Eid et al. | |
| 2005/0185802 | A1 * | 8/2005 | Yoshida | 381/98 |
| 2009/0060237 | A1 * | 3/2009 | Konagai et al. | 381/307 |

FOREIGN PATENT DOCUMENTS

| | | |
|---|---|---|
| JP | 6-311582 | 11/1994 |
| JP | 9-214290 | 8/1997 |
| JP | 10-285698 | 10/1998 |
| JP | 11-55041 | 2/1999 |
| JP | 2000-59897 | 2/2000 |
| JP | 2002-369300 | 12/2002 |
| JP | 2003-5752 | 1/2003 |
| JP | 2007-525075 | 8/2007 |
| WO | WO 2005/004537 A2 | 1/2005 |

OTHER PUBLICATIONS

Office Action issued May 10, 2011, in Japanese Patent Application No. 2006-115808, filed Apr. 19, 2006.

* cited by examiner

*Primary Examiner* — Xu Mei
*Assistant Examiner* — Lao Lun-See
(74) *Attorney, Agent, or Firm* — Oblon, Spivak, McClelland, Maier & Neustadt, L.L.P.

(57) ABSTRACT

An audio signal processing apparatus includes a high-frequency components extraction means for extracting high-frequency components higher than a predetermined cutoff frequency from the input audio signal and supplying them to satellite speakers by way of a predetermined high frequency range amplifier, a low-frequency components extraction means for extracting low-frequency components lower than a predetermined cutoff frequency from the input audio signal, a correlation reducing means for reducing the correlation of the high-frequency components and the low-frequency components of the input audio signal and a delay means for delaying the low-frequency components and supplying them to a sub-woofer by way of a predetermined low frequency range amplifier.

12 Claims, 13 Drawing Sheets

FREQUENCY CHARACTERISTICS OF HIGH PASS FILTER

FREQUENCY CHARACTERISTICS OF LOW PASS FILTER

AUDIO SIGNAL PROCESSING APPARATUS AND AUDIO SIGNAL PROCESSING METHOD

CROSS REFERENCES TO RELATED APPLICATIONS

The present invention contains subject matter related to Japanese Patent Application JP2006-115808 filed in the Japanese Patent Office on Apr. 19, 2006, the entire contents of which being incorporated herein by reference.

BACKGROUND OF THE INVENTION

1. Field of the Invention

This invention relates to an audio signal processing apparatus and an audio signal processing method that can find suitable applications in the field of amplifying audio signals of a plurality of channels and outputting them as audio sounds from a plurality of speakers.

2. Description of the Related Art

Audio amplifiers adapted to be supplied with audio signals of a multiple of channels such as 2-channel or 5.1-channel from a disc player such as a Compact Disc (CD) player or a Digital Versatile Disc (DVD) player and amplify the audio signals of the channels before sending them to corresponding respective speakers are popularly known.

The audio amplifier provides the listener or listeners listening to the audio sounds of the plurality of channels with an effect of correlations and superposition that makes the listener or listeners, whichever appropriate, feel as if sound images were localized at positions other than those of the speakers including inter-speaker positions.

As such audio amplifiers, there are proposed amplifiers that are adapted to localize a sound image at a target position by outputting same reproduced sounds from the speakers arranged at the opposite lateral sides of the target position and also outputting the same reproduced sounds from a speaker arranged above the target position where the sound image is to be localized with a slight time delay when it is not possible to arrange a speaker directly at the target position because a large television set is placed there but it is desired to localize the sound image of the reproduced sound at that target position (see, for example, Jpn. Pat. Appln. Laid-Open Publication No. 2000-59897 (FIG. 2)).

SUMMARY OF THE INVENTION

Meanwhile, 2.1-channel audio amplifiers adapted to accommodate a combination of relatively small lateral 2-channel satellite speakers and a relatively large 1-channel subwoofer are also known.

Generally, 2.1-channel audio system are adapted to output relatively strongly directional sounds of medium-to-high frequency bands from satellite speakers and relatively weakly directional sounds of low frequency band from a subwoofer so that it is possible to accurately localize a sound image between satellite speakers as indicated by the shaded area in the schematic illustration of FIG. 15A of the accompanying drawings when the satellite speakers 103L and 103R are placed in front of the listener 100 at positions that are substantially symmetrical relative to the listener 100.

Since the subwoofer 104 of the 2.1-channel audio system 101 normally has large dimensions and its position of installation is limited, it is more often than not placed at a position other than the right front of the listener 100, which may be a corner of the room. However, the position of the subwoofer 104 does not significantly affect the effect of localization of the sound image regardless of the position of installation thereof in the room because the directional sensitivity of human being is weak relative to low frequency sounds typically below 150 Hz (to be referred to as directivity hereinafter).

There is a demand for downsized satellite speakers 103L and 103R to be used in 2.1-channel audio systems 101 that raise the degree of freedom for positions of installation thereof.

However, when the satellite speakers 103L and 103R are downsized in a 2.1-channel audio system 101, the reproducible lowest frequency, or the lowest reproduction frequency, is raised due to various factors including the diameter and the volume of the speaker units. Then, it is necessary to output sounds of a medium frequency range from the subwoofer 104 in order to compensate the rise of the lowest reproduction frequency.

Then, the sound image that is correctly and properly formed by the satellite speakers 113L and 113R is caused to be disturbed by the sounds of a medium frequency range output from the subwoofer 104 in the 2.1-channel audio system 111 schematically illustrated in FIG. 15B because sounds of a medium frequency range provide certain directivity. Thus, there occurs a problem that it is not possible to accurately localize a sound image.

On the other hand, to use the technique of Jpn. Pat. Appln. Laid-Open Publication No. 2000-59897 of delaying the audio sounds output from the speaker arranged at a high center position, the subwoofer has to be placed substantially at a center position to localize a sound image at the center, or a middle point position of the two lateral satellite speakers. In other words, the technique of Jpn. Pat. Appln. Laid-Open Publication No. 2000-59897 is not necessarily suitable for 2.1-channel audio systems where the position of installation of the subwoofer is limited because of its large dimensions.

In view of the above-identified circumstances, it is therefore desirable to provide an audio signal processing apparatus and an audio signal processing method that can properly localize a sound image when the satellite speakers of an audio system is downsized.

According to an embodiment of the present invention, the above and other problems are solved by extracting high-frequency components higher than a predetermined cutoff frequency from the input audio signal, supplying them to satellite speakers by way of a predetermined high-frequency amplifier and also extracting low-frequency components lower than a predetermined cutoff frequency from the input audio signal to reduce the correlation of the high-frequency components and the low-frequency components of the input audio signal so as to supply the low-frequency components to a subwoofer by way of a predetermined low frequency range amplifier after delaying them.

With this arrangement, the sound image of the satellite speakers is separated from the audio sounds output from the subwoofer by reducing the correlation of the audio sounds output from the satellite speakers and the audio sounds output from the subwoofer. Additionally, the audio sounds output from the satellite speakers can give rise to an effect of leading sounds when the audio sounds output from the subwoofer are delayed. Then, as a result, the listener recognizes the satellite speakers as sound sources so that the sound image formed by the audio sounds output from the satellite speakers is not disturbed by the audio sounds output from the subwoofer.

As pointed out above, according to the present invention, the sound image of the satellite speakers is separated from the audio sounds output from the subwoofer by reducing the correlation of the audio sounds output from the satellite speakers and the audio sounds output from the subwoofer. Additionally, the audio sounds output from the satellite speakers can give rise to an effect of leading sounds when the audio sounds output from the subwoofer are delayed. Then, as a result, the listener recognizes the satellite speakers as sound sources so that the sound image formed by the audio sounds output from the satellite speakers is not disturbed by the audio sounds output from the subwoofer. Thus, it is possible to realize an audio signal processing apparatus and an audio signal processing method that can properly localize a sound image when the satellite speakers of an audio system is downsized.

The nature, principle and utility of the invention will become more apparent from the following detailed description when read in conjunction with the accompanying drawings in which like parts are designate by like reference numerals or characters.

DETAILED DESCRIPTION OF THE PREFERRED EMBODIMENTS

Now, embodiments of the present invention will be described in greater detail by referring to the accompanying drawings.

(1) First Embodiment

(1-1) Overall Configuration of Audio System

Figure 1:
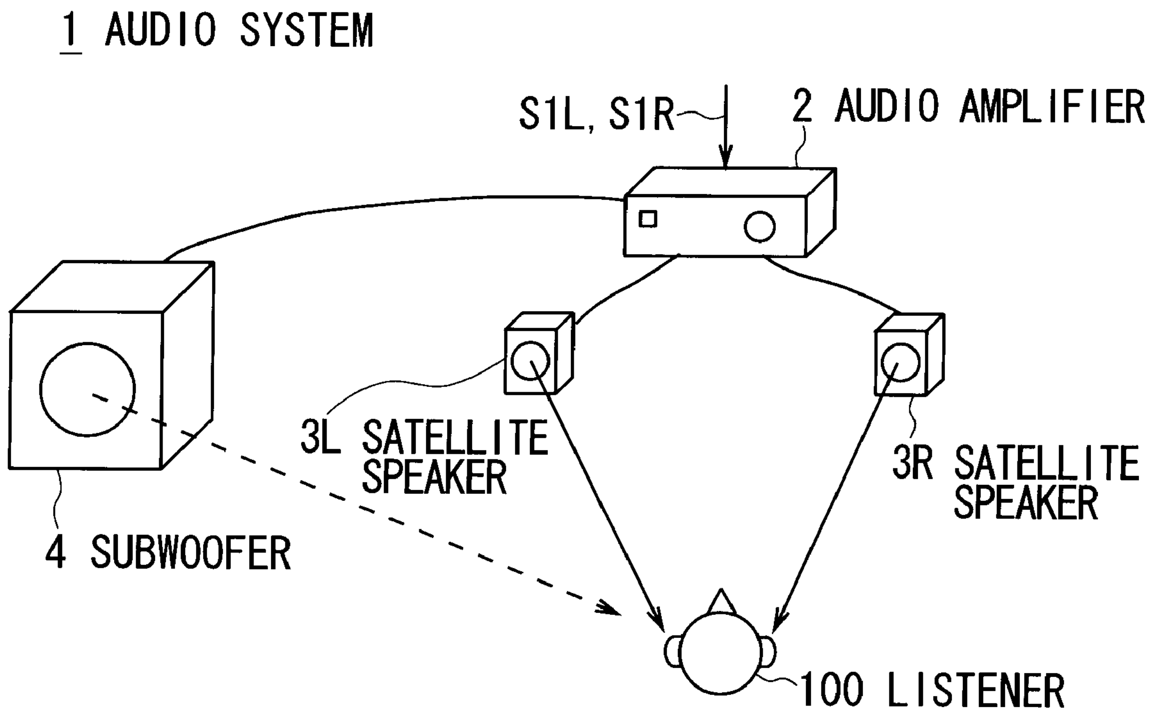
FIG. 1 is a schematic diagram of an audio system realized by applying the first embodiment of the present invention, illustrating the overall configuration thereof.

Referring to FIG. 1, an audio system 1 realized by applying the first embodiment of the present invention is adapted to reproduce 2-channel audio signals S1L and S1R as audio sounds of 2.1-channel. The audio signals S1L and S1R of the left and right 2-channel supplied from a sound source such as a CD player (not shown) are amplified by an audio amplifier 2 and supplied to left and right satellite speakers 3L and 3R and a subwoofer 4. Then, a listener 100 can listen to the audio sounds output from the speakers that correspond to the audio signals S1L and S1R.

Like ordinary 2.1-channel audio systems, the audio system 1 is designed by taking the fact that the perceptibility (sense of direction: directivity) of human being relative to the positions of sound sources is difficult according to frequencies into consideration. Thus, the audio signals S1L and S1R are divided into a highly directional medium-to-high frequency range and a lowly directional medium-to-low frequency range at a predetermined crossover frequency that is selected as boundary and highly directional sounds of the medium-to-high frequency range are output from the satellite speakers 3L and 3R, while lowly direction sounds of the medium-to-low frequency range are output from the subwoofer 4.

As shown in FIG. 1, in the audio system 1, the satellite speakers 3L and 3R for outputting highly directional sounds of the medium-to-high frequency range are arranged at transversally substantially symmetrical positions in front of the listener 100, so that the listener 100 can listen to audio sounds with properly localized sound images.

Meanwhile, about 150 Hz is selected for the crossover frequency of ordinary 2.1-channel audio systems so that the subwoofer whose position is not particularly limited may not output sounds of the directional frequency band. Then, each of the satellite speakers of the ordinary 2.1-channel audio system requires a minimal volume of about 0.5 L so that the lowest reproduction frequency of the satellite speaker may not be higher than about 150 Hz.

To the contrary, about 650 Hz is selected as the crossover frequency of this audio system 1. It is much higher than the crossover frequency of ordinary 2.1-channel audio system.

With this arrangement, the audio system 1 can raise the lowest reproduction frequency of the satellite speakers 3L and 3R if compared with ordinary 2.1-channel audio systems. Thus, it is possible to reduce the outer diameter of the diaphragms and the volume of the speaker units of the audio system 1 and hence downsize the satellite speakers 3L and 3R. As a matter of fact, each of the satellite speakers 3L and 3R has a volume of as small as about 0.025 L.

On the other hand, the subwoofer 4 has a relatively large volume and, since the crossover frequency is relatively high, it can output not only sounds of the lowly directional frequency range but also sounds of the medium frequency range that is directional to some extent.

While sounds of the medium-to-low frequency range that are directional to some extent are output from the subwoofer 4, the audio system 1 is so designed that the sound image formed by the satellite speakers 3L and 3R is not disturbed by the sounds of the medium-to-low frequency range output from the subwoofer 4 (as will be described in greater detail hereinafter). Thus, with the audio system 1, the subwoofer 4 can be installed at any arbitrarily selected position while the sound image is properly localized.

The audio amplifier 2 generates medium-to-high range audio signals SHL and SHR that mainly contain medium-to-high range components above the crossover frequency and match the characteristics of the satellite speakers 3L and 3R on the basis of the 2-channel audio signals S1L and S1R and supplies the signals to the satellite speakers 3L and 3R.

The audio amplifier 2 also mainly extracts the medium-to-low range components below the crossover frequency from the 2-channel audio signals S1L and S1R in view of the frequency components of the medium-to-high audio signals SHL and SHR and supplies to the subwoofer 4 the medium-to-low range audio signal SL generated by adding the signals of the left and right channels.

In this way, the audio system 1 generates medium-to-high range audio signals SHL and SHR and a medium-to-low range audio signal SL from the 2-channel audio signals S1L and S1R by means of the audio amplifier 2 according to the selected relatively high crossover frequency and supplies them respectively to the satellite speakers 3L and 3R and the subwoofer 4 so that the listener 100 may be able to listen to the audio sounds with a properly localized sound image.

(1-2) Circuit Configuration of Audio Amplifier

Figure 2:
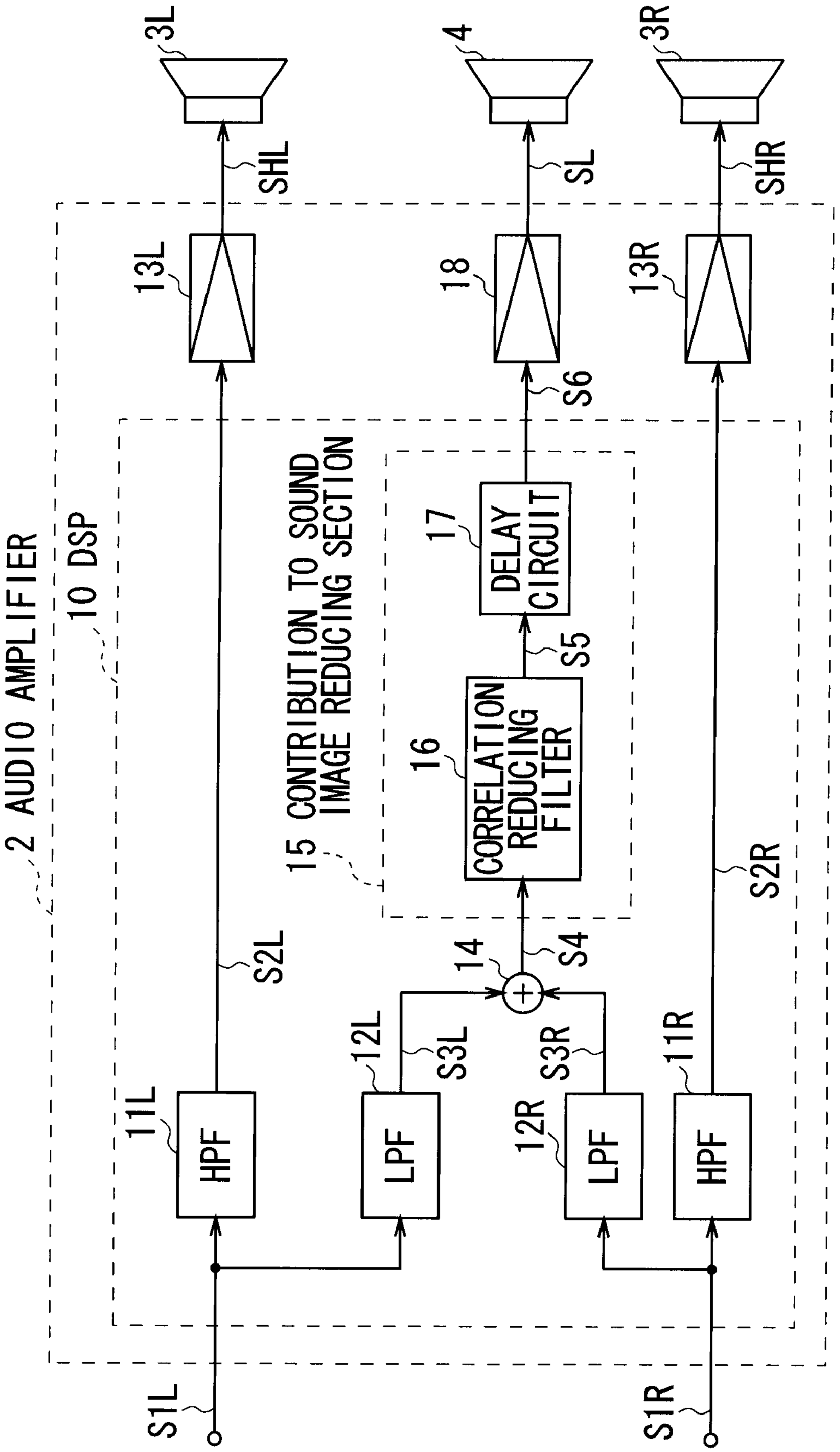
FIG. 2 is a schematic block diagram of an audio amplifier realized by applying the first embodiment of the present invention, illustrating the circuit configuration thereof.

Referring to FIG. 2, the audio amplifier 2 is formed by using a DSP (digital signal processor) 10 as main component. The DSP 10 is adapted to execute various processes including audio signal processing operations by reading out any of various programs such as a basic program and an audio signal processing program from a ROM (read only memory) (not shown) and executing the programs it reads out.

The DSP 10 is also adapted to realize various functional blocks such as high pass filters (HPFs) 11L and 11R and low pass filters (LPFs) 12L and 12R as shown in FIG. 2 by executing the audio signal processing program.

As a matter of fact, the DSP 10 supplies the left channel audio signal S1L and the right channel audio signal S1R obtained from a sound source (not shown) respectively to the high pass filter (HPF) 11L and the low pass filter (LPF) 12L and to the high pass filter (HPF) 11R and the low pass filter (LPF) 12R.

Figure 3A:
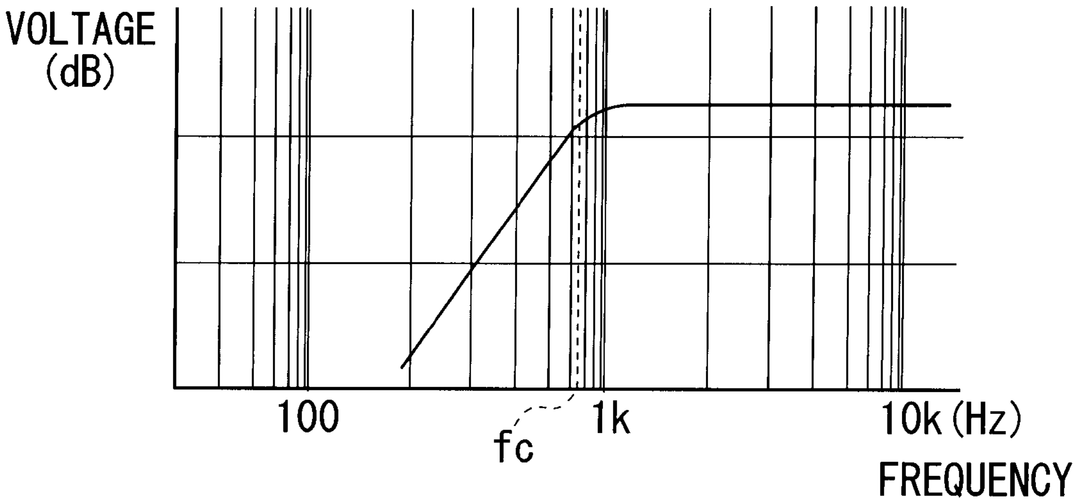
FIGS. 3A and 3B are graphs illustrating the frequency characteristics of a high pass filter and that of a low pass filter.

The high pass filters 11L and 11R are adapted to extract medium-to-high range components of frequencies higher than a cutoff frequency fc that is same as the crossover frequency and frequency characteristics as illustrated in FIG. 3A respectively from the audio signals S1L and S1R to generate audio signals S2L and S2R mainly containing medium-to-high range components and supplies the signals to respective amplifier circuits 13L and 13R.

In response, the amplifier circuits 13L and 13R respectively amplify the audio signals S2L and S2R to produce medium-to-high range audio signals SHL and SHR and supply them to the satellite speakers 3L and 3R, which by turn output medium-to-high frequency sounds.

Figure 3B:
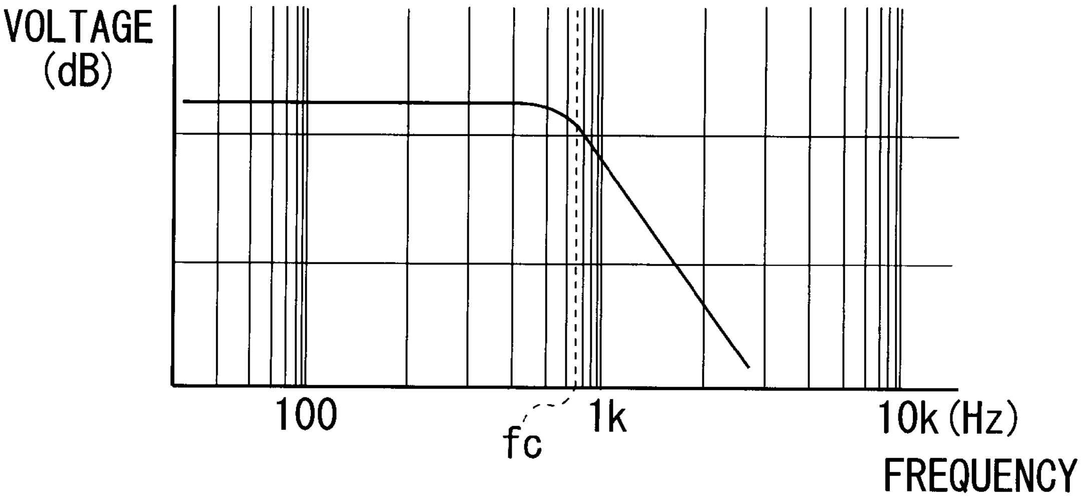

On the other hand, the lowpass filters 12L and 12R are adapted to extract medium-to-low range components of frequencies lower than a cutoff frequency fc and frequency characteristics as illustrated in FIG. 3B respectively from the audio signals S1L and S1R to generate audio signals S3L and S3R mainly containing medium-to-low range components and supplies the signals to an adder 14, which adds the left and right audio signals S3L and S3R to generate a medium-to-low range audio signal S4.

Then, since the crossover frequency, or the cutoff frequency fc of the high pass filters 11L and 11R and the low pass filters 12L and 12R is about 650 Hz as described above in the audio amplifier 2, the audio sounds output for the medium-to-low range audio signal S4 may be directional to some extent.

Figure 15A:
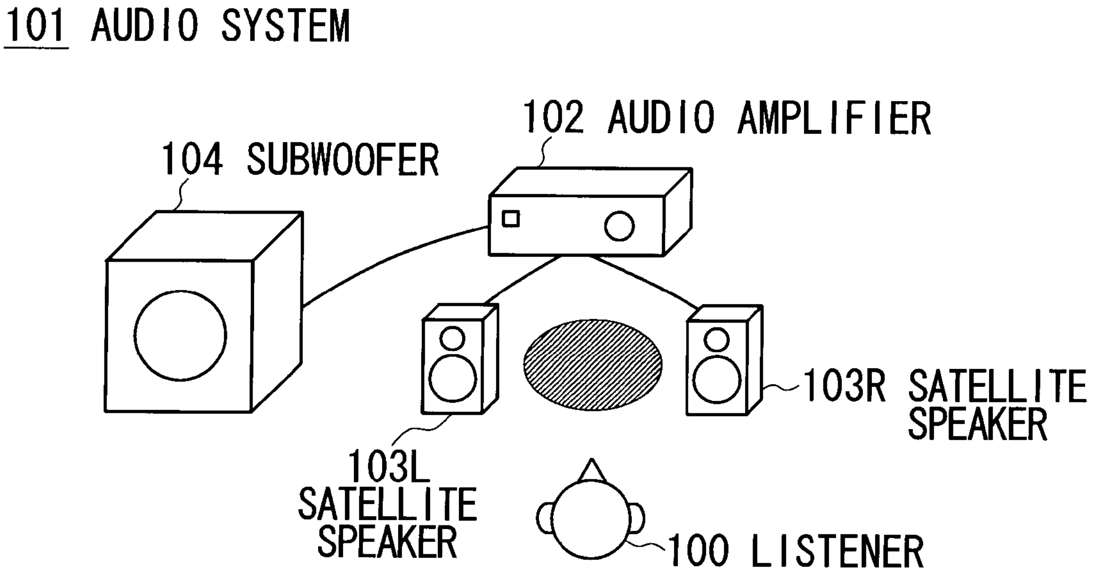
FIG. 15A (RELATED ART)
FIG. 15 is a schematic diagram of a known audio system.
Figure 15B:
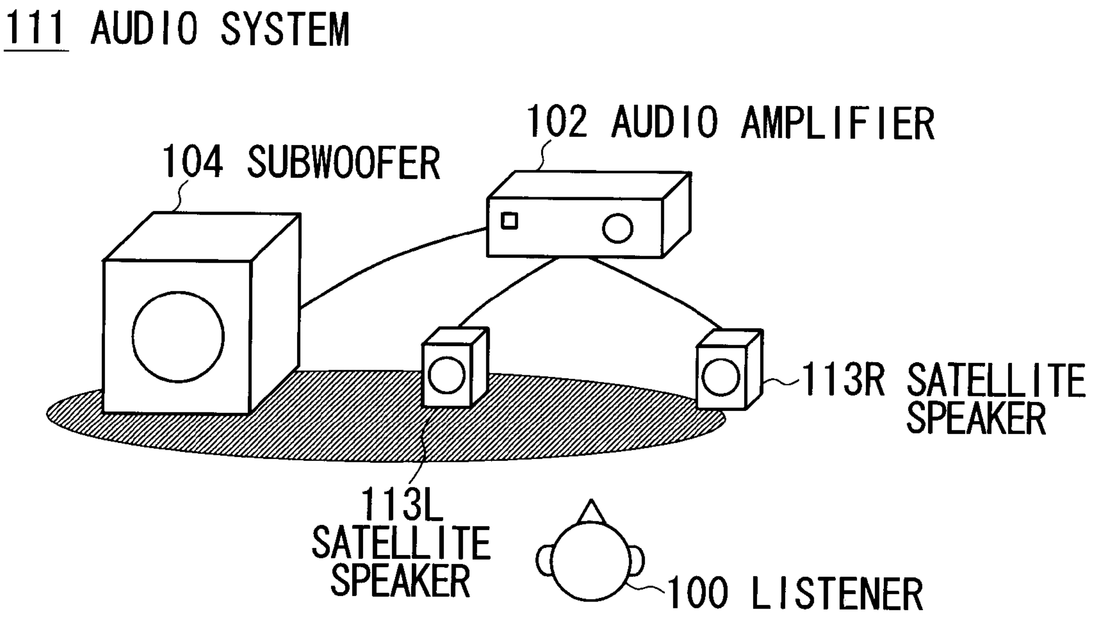
FIG. 15B (RELATED ART)

Therefore, if the audio amplifier 2 simply amplifies the audio signal S4 and outputs the corresponding sounds from the subwoofer 4, they would disturb the sound field formed by the satellite speakers 3L and 3R as illustrated in FIG. 15B.

Thus, the audio amplifier 2 is adapted to reduce the influence of the audio sounds output from the subwoofer 4 on the position and the size of the sound image by means of a contribution to sound image reducing section 15.

More specifically, the contribution to sound image reducing section 15 of the audio amplifier 2 reduces the correlation of the audio signal S4 supplied from the adder 14 and the audio signals S2L and S2R by means of a correlation reducing filter 16.

Figure 4:
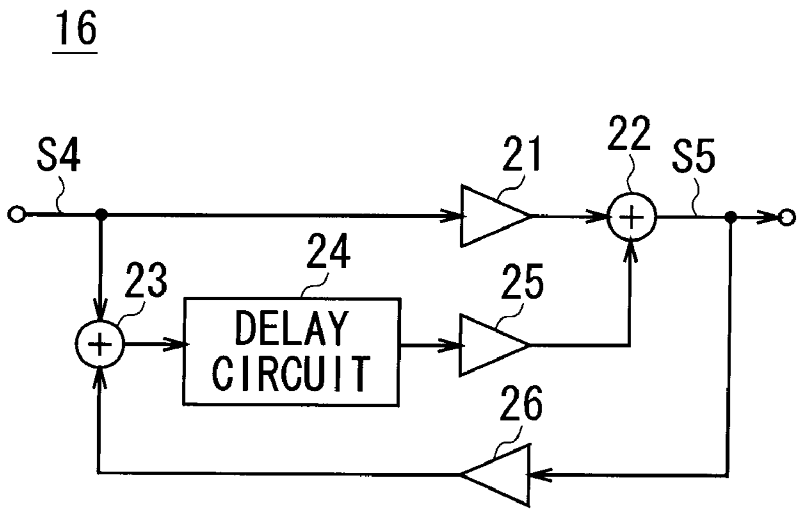
FIG. 4 is a schematic block diagram of a correlation reducing filter, illustrating the configuration thereof.

The correlation reducing filter 16 is formed as a so-called IIR (infinite impulse response) digital filter that actually processes various signals by way of processing operations of the DSP 10 but functionally has a circuit configuration as shown in FIG. 4. The correlation reducing filter 16 supplies the audio signal S4 coming from the adder 14 (FIG. 2) to an adder 22 by way of an amplifier 21 and, at the same time, delays the signal by a clock time by way of an adder 23 and by means of a delay circuit 24. Then, it supplies the delayed audio signal S4 to the adder 22 by way of an amplifier 25.

Subsequently, the correlation reducing filter 16 adds the audio signal that is supplied from the amplifier 21 and the audio signal preceding by a clock time that is supplied from the amplifier 25 to generate a correlation reducing audio signal S5. Then, it supplies the signal S5 to a downstream delay circuit 17 (FIG. 2) and also to the adder 23 via the amplifier 26 as feedback.

Figure 5:
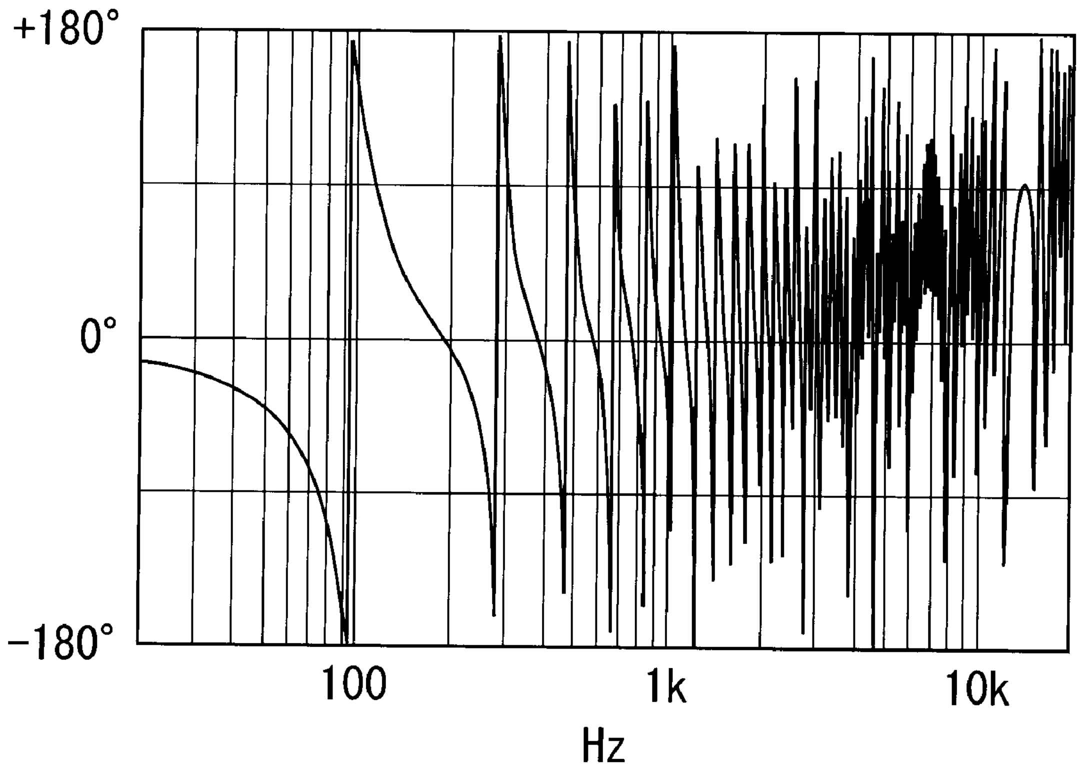
FIG. 5 is a graph illustrating the frequency-phase characteristics of a correlation reducing filter.

Thus, while the correlation reducing filter 16 changes the phase of the audio signal S4 according to frequencies in a manner as shown in the frequency-phase characteristics graph in FIG. 5, it does not change but maintains the sound pressure level so that it operates as a so-called all pass filter.

Although the correlation reducing filter 16 actually linearly changes the phase relative to the frequency, the characteristics are shown as curved lines in FIG. 5 because the range of phase is limited for −180° to +180° and the axis of frequency is expressed by means of a logarithmic scale.

Thus, as a result, the correlation reducing audio signal S5 generated by the correlation reducing filter 16 shows only a phase change as a function of frequency but does not show any change in the sound pressure level relative to the original audio signal S4. In other words, the correlation reducing audio signal S5 shows a phase change relative to the audio signals S2L and S2R (FIG. 2) mainly containing medium-to-high range components. Differently stated, the correlation reducing audio signal S5 shows a reduced correlation relative to the audio signals S2L and S2R.

In this way, the correlation reducing filter 16 is adapted to generate a correlation reducing audio signal S5 that shows a reduced correlation relative to the audio signals S2L and S2R by changing only the phase according to frequencies without changing any sound pressure level relative to the audio signal S4.

Figure 6:
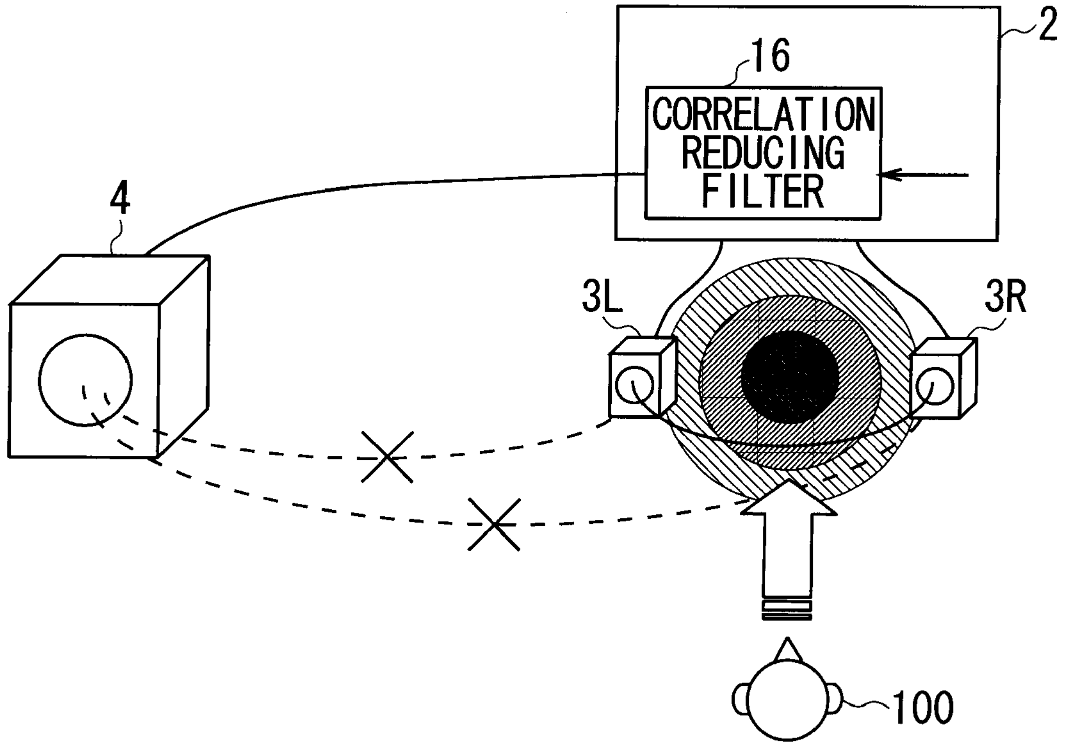
FIG. 6 is a schematic diagram illustrating the influence of a correlation reducing filter on a sound image.

If the correlation reducing audio signal S5 is amplified and supplied to the subwoofer 4, the audio sounds output from the subwoofer 4 shows a reduced correlation relative to the audio sounds output from each of the satellite speakers 3L and 3R as schematically illustrated in FIG. 6.

When the audio sounds output from the satellite speaker 3L and those output from the satellite speaker 3R are correlated, a single sound image is formed by the two speakers (satellite speakers 3L and 3R). Then, the listener 100 strongly recognizes the sound image formed by the two speakers satellite speakers 3L and 3R) due to auditory characteristics rather than the sound image formed by the single speaker (subwoofer 4).

Therefore, with the audio system of FIG. 6, the audio sounds output from the satellite speaker 3L are separated from the audio sounds output from the subwoofer 4 and the audio sounds output from the satellite speaker 3R are separated from the audio sounds output from the subwoofer 4 so that the sound image of the satellite speakers 3L and 3R expands. Then, as a result, the sound image formed by the satellite speakers 3L and 3R becomes dominant and the listener 100 perceives as if the sound image is localized between the satellite speakers 3L and 3R.

Then, the contribution to sound image reducing section 15 (FIG. 2) delays the correlation reducing audio signal S5 by about 5 ms by means of the delay circuit 17 to generate a correlation reducing delayed audio signal S6 and supplies it to an amplifier circuit 18.

If the audio signal S4 is delayed by means of the delay circuit 17 to generate a delayed audio signal S4D, which is amplified and supplied to the subwoofer 4, the medium-to-low sounds output from the subwoofer 4 get to the ears of the listener 100 with a delay relative to the medium-to-high sounds output from the satellite speakers 3L and 3R.

Figure 7:
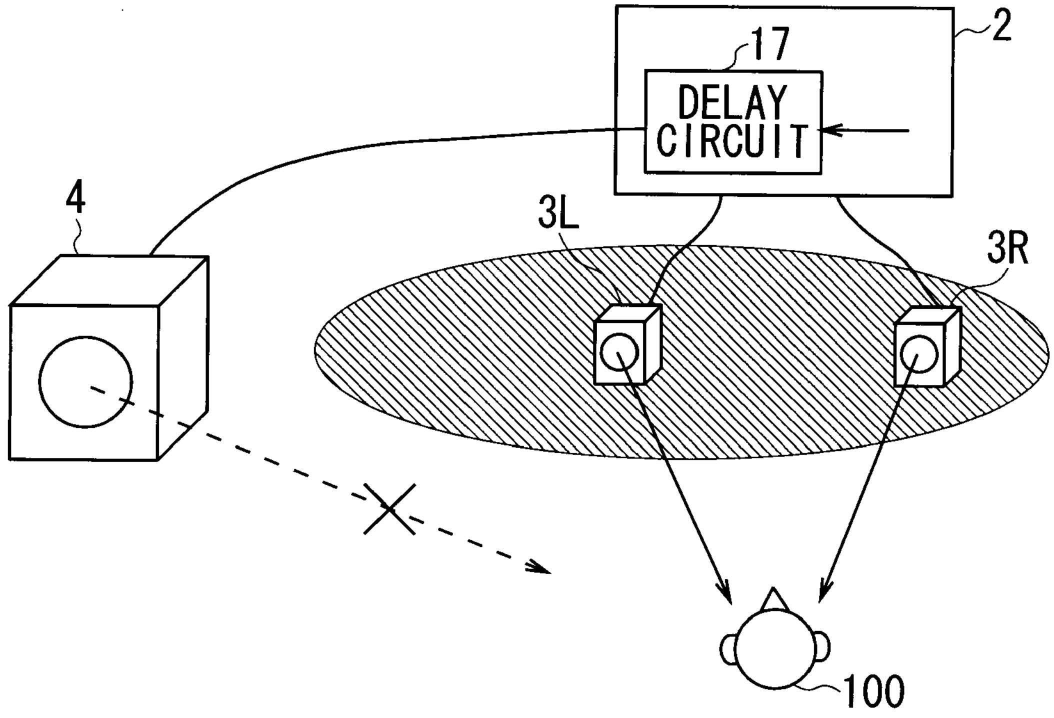
FIG. 7 is a schematic diagram illustrating the influence of a delay circuit on a sound image.

Then, if the medium-to-low sounds from the subwoofer 4 are directional to some extent in the audio system of FIG. 7, the listener 100 perceives as if the sound source were located in direction of the satellite speakers 3L and 3R from which audio sounds arrive first due to the so-called precedence effect (Haas effect) so that consequently the directivity of medium-to-low sounds from the subwoofer 4 is weakened.

The amplifier circuit 18 amplifies the correlation reducing delayed audio signal S6 supplied from the delay circuit 17 to produce a medium-to-low range audio signal SL and supplies it to the subwoofer 4 so that the correlation of the medium-to-low sounds output from the subwoofer 4 and the medium-to-high sounds output from the satellite speakers 3L and 3R is lowered and the medium-to-low sounds output from the subwoofer 4 are delayed slightly from the medium-to-high sounds.

In this way, the audio amplifier 2 can generate a medium-to-low range audio signal SL having a reduced influence on the sound image by reducing the correlation with the medium-to-high range audio signals SHL and SHR and slightly delay it by means of the correlation reducing filter 16 and the delay circuit 17 of the contribution to sound image reducing section 15.

As a result, the audio amplifier 2 outputs the highly directional medium-to-high sounds from the satellite speakers 3L and 3R on the basis of the audio signals S1L and S1R supplied to it and also the medium-to-low sounds whose correlation with the medium-to-high sounds is reduced and which are delayed from the latter sounds from the subwoofer 4.

Thus, the audio system 1 can properly localize a sound image by means of the highly directional medium-to-high sounds output from the satellite speakers 3L and 3R and compensate the medium-to-low range below the crossover frequency by the medium-to-low sounds output from the subwoofer 4 without disturbing the sound image so that it can properly localize a sound image as a whole and have the listener 100 listen to audio sounds with good frequency characteristics.

(1-3) Audio Signal Processing Sequence

Figure 8:
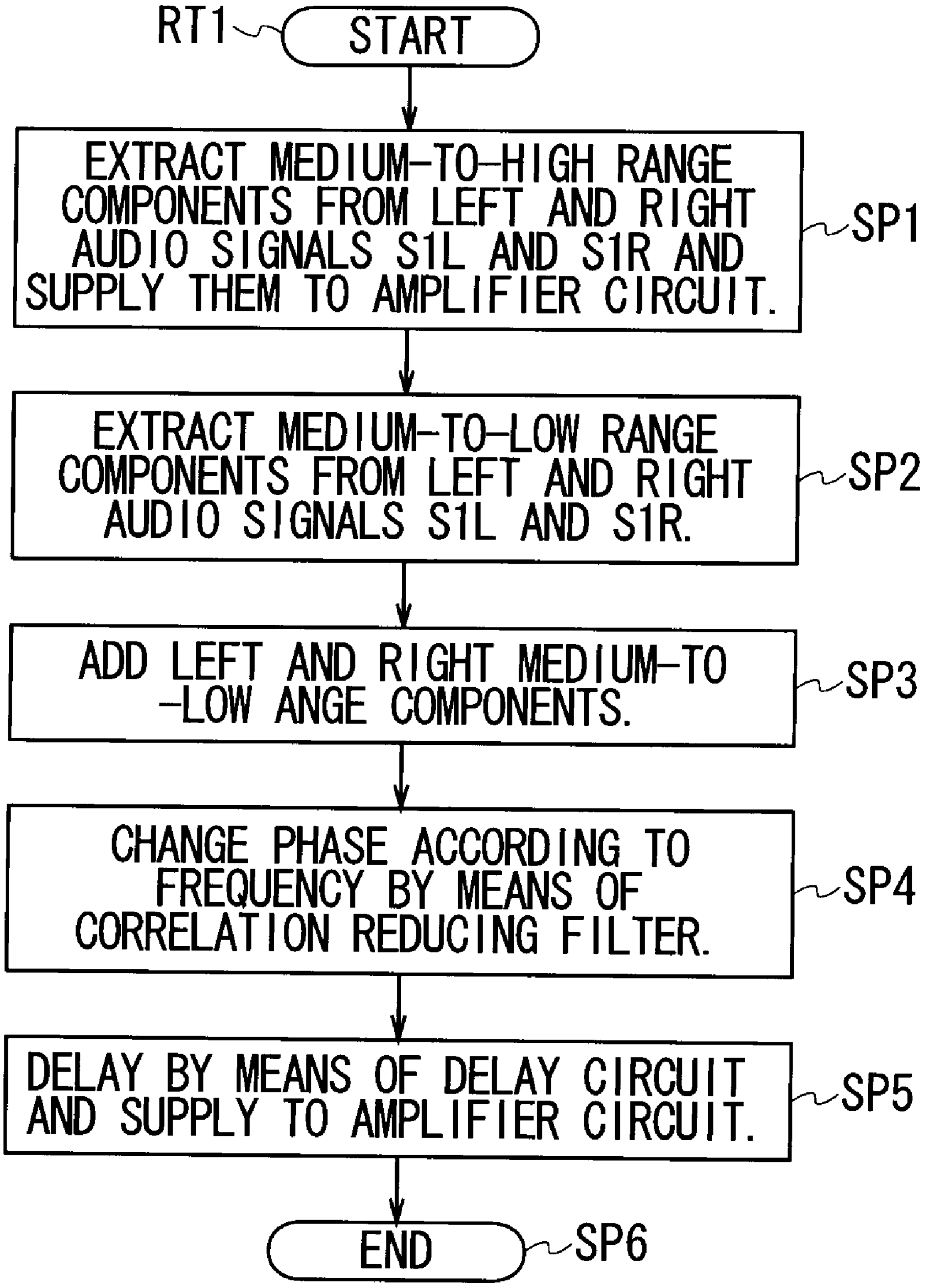
FIG. 8 is a flowchart of the audio signal processing sequence of the first embodiment.

Now, the audio signal processing sequence RT1 to be followed by the DSP 10 of the audio amplifier 2 when it generates medium-to-high range audio signals SHL and SHR and medium-to-low range audio signal SL from audio signals S1L and S1R will be described below by referring to the flowchart of FIG. 8.

As the audio amplifier 2 is energized from the power sensor, the DSP 10 of the audio amplifier 2 reads out the audio signal processing program from the ROM (not shown) and executes it to start the audio signal processing sequence RT1. Then, it moves to Step SP1, where the DSP 10 extracts the medium-to-high range components from the audio signals S1L and S1R by means of the high pass filters 11L and 11R to generate audio signals S2L and S2R and supplies these signals respectively to the amplifier circuits 13L and 13R before it moves to the next step, or Step SP2.

The amplifier circuits 13L and 13R respectively generate medium-to-high range audio signals SHL and SHR by amplifying the audio signals S2L and S2R.

In Step SP2, the DSP 10 extracts medium-to-low range components from the audio signals S1L and S1R respectively by means of the low pass filters 12L and 12R to produce medium-to-low range audio signals S3L and S3R and moves to the next step, or Step SP3.

In Step SP3, the DSP 10 generates audio signal S4 by adding the audio signals S3L and S3R by means of the adder 14 and then moves to the next step, or Step SP4.

In Step SP4, the DSP 10 generates correlation reducing audio signal S5 for reducing the correlation relative to the audio signals S2L and S2R by changing the phase of the audio signal S4 according to the frequency by means of the correlation reducing filter 16 of the contribution to sound image reducing section 15 and then moves to the next step, or Step SP5.

In Step SP5, the DSP 10 generates a correlation reducing delayed audio signal S6 that is slightly delayed from the correlation reducing audio signal S5 by means of the delay circuit 17 of the contribution to sound image reducing section 15 and then moves to Step SP6, where it ends the audio signal processing sequence RT1.

Note that at this time the amplifier circuit 18 generates the medium-to-low range audio signal SL by amplifying the correlation reducing delayed audio signal S6.

Then, the DSP 10 executes the audio signal processing sequence RT1 at each predetermined clock time and successively generates medium-to-high range audio signals SHL and SHR and medium-to-low range audio signal SL from the audio signals S1L and S1R supplied successively from the sound source (not shown).

(1-4) Operation and Advantages

With the above-described arrangement, the audio amplifier 2 generates medium-to-high range audio signals S2L and S2R by mainly extracting medium-to-high range components from audio signals S1L and S1R by means of the high pass filters 11L and 11R and amplifies them respectively by means of the amplifier circuits 13L and 13R to produce medium-to-high range audio signals SHL and SHR, which are then supplied to the satellite speakers 3L and 3R.

Additionally, the audio amplifier 2 generates medium-to-low range audio signals S3L and S3R by mainly extracting medium-to-low range components from the audio signals S1L and S1R by means of the low pass filters 12L and 12R, adds them by means of the adder 14 to produce audio signal S4 and subsequently reduces the correlation relative to the audio signals S2L and S2R by changing the phase according to the frequency by means of the correlation reducing filter 16 of the contribution to sound image reducing section 15. Then, it slightly delays the audio signal to generate correlation reducing delayed audio signal S6 by means of the delay circuit 17 and amplifies it by means of the amplifier circuit 18 so as to supply it as medium-to-low range audio signal SL to the subwoofer 4.

As a result, in the audio system 1, the highly directional medium-to-high sounds output from the satellite speakers 3L and 3R properly localize the sound image and, at the same time, the medium-to-low sounds output from the subwoofer 4 compensate the medium-to-low ranges that the satellite speakers 3L and 3R are not able to accommodate.

Figure 9A:
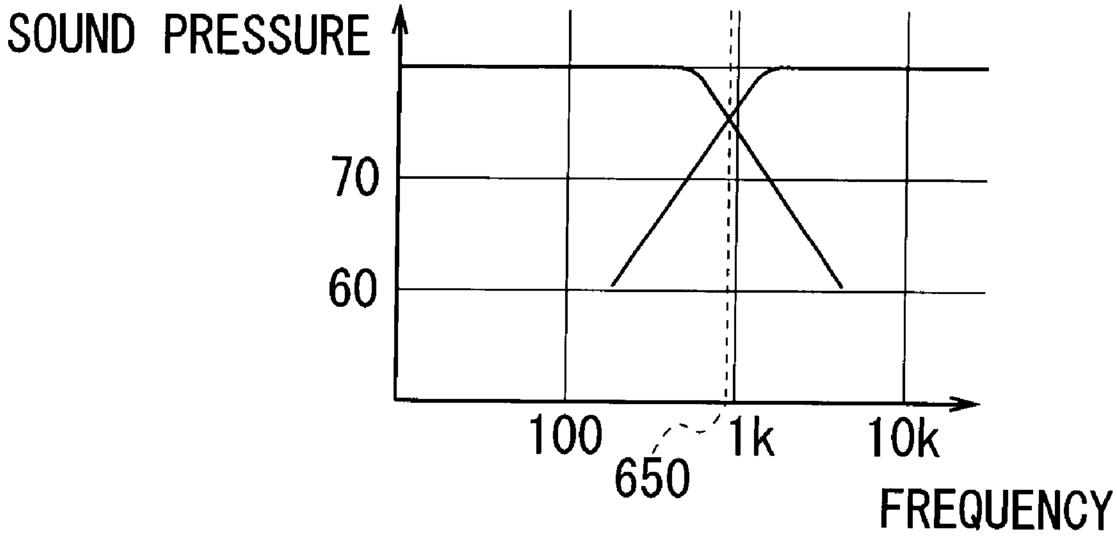
FIGS. 9A and 9B are graphs illustrating crossover frequencies.

Since the crossover frequency of medium-to-low sounds and medium-to-high sounds is defined to be about 650 Hz in the audio system 1 as shown in FIG. 9A, the medium-to-low sounds output from the audio system are directional to some extent. However, since the correlation reducing filter 16 of the contribution to sound image reducing section 15 separates the sound image of the satellite speakers 3L and 3R from the audio sounds output from the subwoofer 4 by reducing the correlation of the audio sounds output from the satellite speakers and the audio sounds output from the subwoofer 4, while maintaining the sound pressure and the frequency characteristics of the audio signal S4, it is possible to reduce the influence of the audio sounds from the subwoofer 4 on the sound image formed by the audio sounds from the satellite speakers 3L and 3R.

Additionally, in the audio system 1, the delay circuit 17 of the contribution to sound image reducing section 15 delays the correlation reducing audio signal S5 by about 5 ms so that the audio sounds output from the satellite speakers 3L and 3R get to the ears of the listener 100 before the audio sounds output from the subwoofer 4. Thus, it is possible to make the listener 100 perceive the position of the sound source as located near the satellite speakers 3L and 3R due to the so-called precedence effect (Haas effect) as shown in FIG. 7.

Thus, as a result, when the frequency components of the audio signals S1L and S1R are allocated to the satellite speakers 3L and 3R and the subwoofer 4 in the audio system 1, it is possible to prevent the sound image formed by the audio sounds output from the satellite speakers 3L and 3R from being disturbed by the medium-to-low range sounds output from the subwoofer 4 so that the sound image is properly localized between the satellite speakers 3L and 3R and the listener 100 can listen to audio sounds showing excellent frequency characteristics.

Figure 9B:
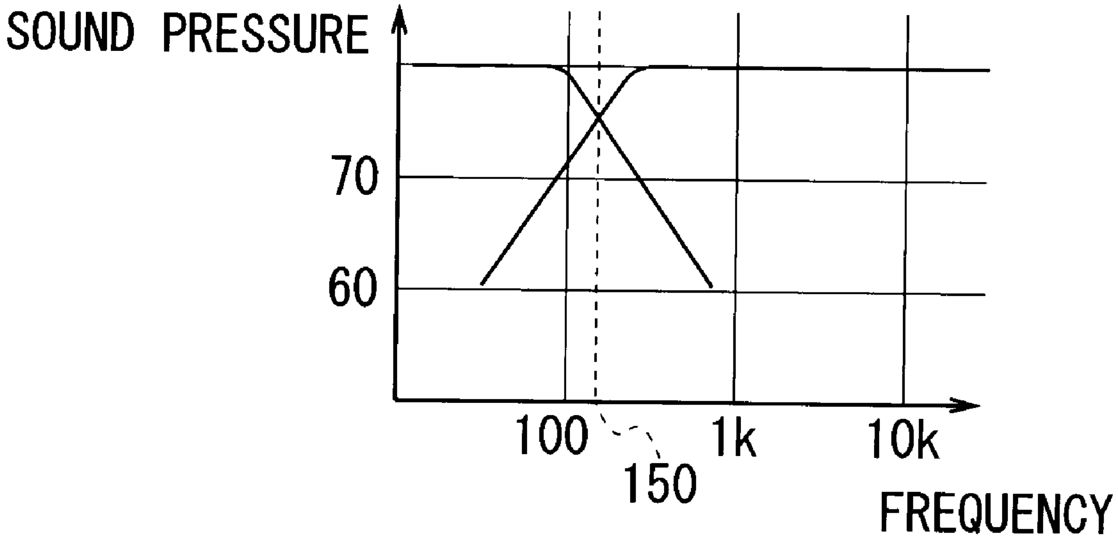

Additionally, since the crossover frequency of medium-to-low sounds and medium-to-high sounds is defined to be about 650 Hz (FIG. 9A) in the audio system 1, which is remarkably higher than the crossover frequency of about 150 Hz of ordinary 2.1-channel audio systems as shown in FIG. 9B, it is possible to reduce the volume of each of the satellite speakers 3L and 3R to about 0.025 L, which is very smaller than the volume of ordinary satellite speakers of 0.5 L, while maintaining the output sound pressure level of the satellite speakers 3L and 3R. Then, it is possible to remarkably improve the degree of freedom for the positions of installation of the satellite speakers 3L and 3R.

The audio system 1 is not limited to a home use audio system and may be a car audio system mounted in an automobile. Then, the downsized satellite speakers 3L and 3R can be installed at positions close to the height of the ears of the listener such as the door pillars or the dashboard of the vehicle to improve the localization of the sound image in the inside space of the vehicle.

Additionally, the woofers for the low frequency range that are normally installed in the doors of the vehicle can be replaced by a single subwoofer 4 that can be installed in the trunk of the vehicle to reduce the overall weight of the vehicle.

Thus, with the above-described arrangement, the audio system 1 outputs highly directional medium-to-high sounds, for which the crossover frequency is elevated, from the downsized satellite speakers 3L and 3R and, at the same time, medium-to-low sounds whose frequency components are maintained but contribution to the sound image is reduced by reducing the correlation of audio signal S4 for medium-to-low sounds, which are directional to some extent, relative to the medium-to-high sounds by means of the correlation reducing filter 16 and slightly delaying them relative to the medium-to-high sounds by means of the delay circuit 17, from the subwoofer 4. Then, the sound image formed by the audio sounds output from the satellite speakers 3L and 3R is not disturbed by the audio sounds output from the subwoofer 4 so that it is possible to raise the degree of freedom for the positions of installation of the satellite speakers and make the listener 100 to listen to audio sounds by which a sound image is properly localized and which shows excellent frequency characteristics.

(2) Second Embodiment

(2-1) Overall Configuration of Audio System

Figure 10:
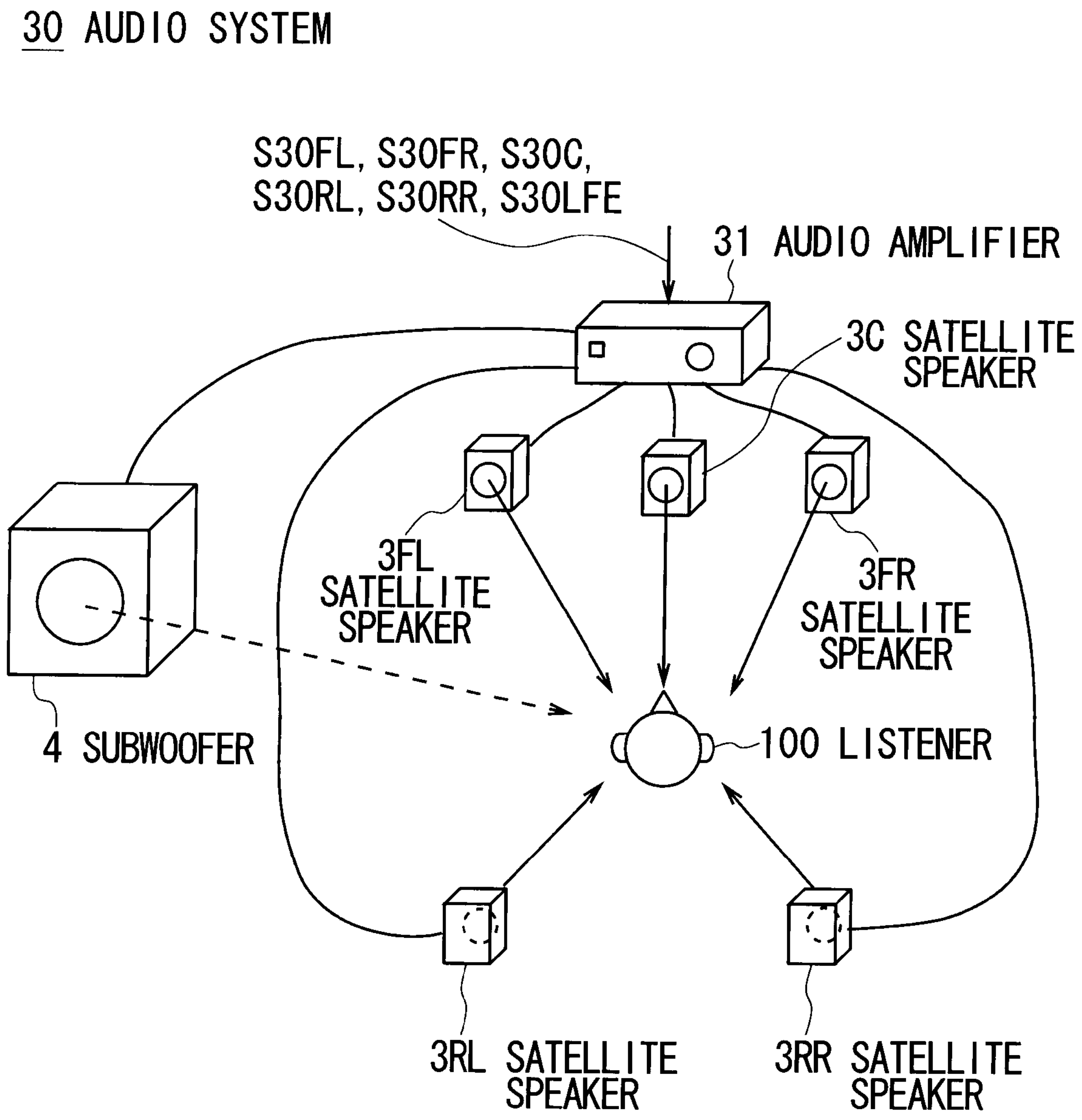
FIG. 10 is a schematic diagram of an audio system realized by applying the second embodiment of the present invention, illustrating the overall configuration thereof.

Referring to FIG. 10, where the components corresponding to those of FIG. 1 are denoted respectively by the same reference symbols, the audio system 30 realized by applying the second embodiment of the present invention includes an increased number of channels if compared with the audio system 1 (FIG. 1) realized by applying the first embodiment. More specifically, it is a so-called 5.1-channel audio system including five satellite speakers 3FL, 3C, 3FR, 3RL and 3RR and a subwoofer 4.

Thus, instead of the audio amplifier 2 of the audio system 1 adapted to the 2.1-channel, the audio system 30 includes an audio amplifier 31 adapted to the 5.1-channel. Otherwise, this audio system 30 has a configuration similar to that of the above-described audio system 1.

(2-2) Circuit Configuration of Audio Amplifier

Figure 11:
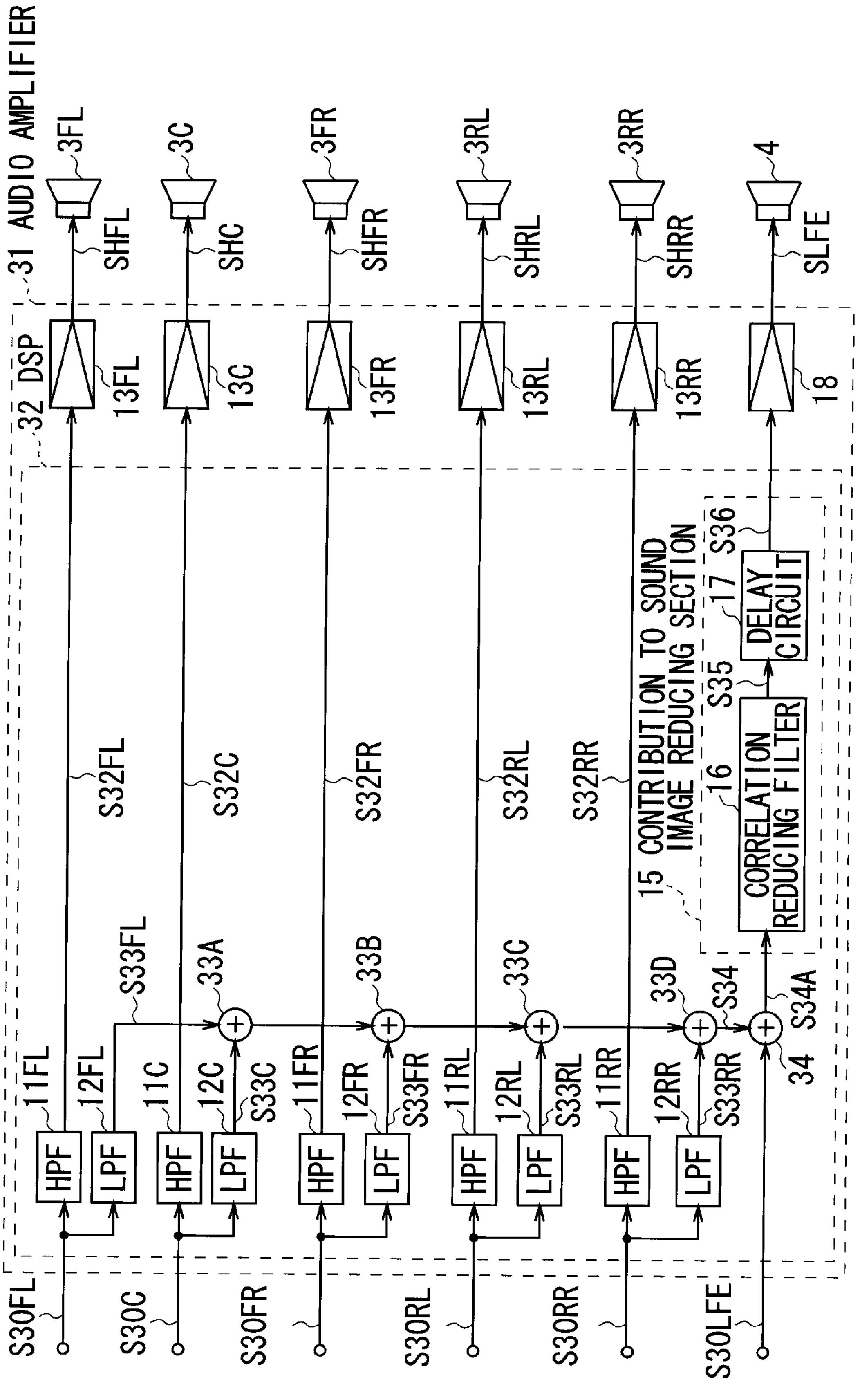
FIG. 11 is a schematic block diagram of an audio amplifier realized by applying the second embodiment of the present invention, illustrating the circuit configuration thereof.

Referring to FIG. 11, where the components corresponding to those of FIG. 2 are denoted respectively by the same reference symbols, the audio amplifier 31 is formed by using a DSP 32 that corresponds to the DSP 10 (FIG. 2) as main component.

More specifically, the DSP 32 is formed by expanding the DSP 10 and is adapted to be supplied from a sound source such as a Digital Versatile Disc (DVD) player (not shown) with 5.1-channel audio signals including audio signal S30FL for the front left channel, audio signal S30C for the center channel, audio signal S30FR for the front right channel, audio signal S30RL for the rear left channel, audio signal S30RR for the rear right channel and audio signal S30LFE for the low-frequency channel.

As a matter of fact, like the DSP 10, the DSP 32 supplies the audio signal S30FL to high pass filter 1FL and low pass filter 12FL, the audio signal S30C to high pass filter 11C and low pass filter 12C, the audio signal S30FR to high pass filter 11FR and low pass filter 12FR, the audio signal S30RL to high pass filter 11RL and low pass filter 12RL and the audio signal S30RR to high pass filter 11RR and low pass filter 12RR.

The high pass filters 11FL, 11C, 11FR, 11RL and 11RR are similar to the high pass filter 11L and 11R and adapted to extract medium-to-high range components of frequencies higher than a cutoff frequency fc (about 650 Hz) from the respective audio signals S30FL, S30C, S30FR, S30RL and S30RR to produce medium-to-high range audio signals S32FL, S32C, S32FR, S32RL and S32RR and supplies them to respective amplifier circuits 13FL, 13C, 13FR, 13RL and 13RR.

In response, the amplifier circuits 13FL, 13C, 13FR, 13RL and 13RR respectively amplify the audio signals S32FL, S32C, S32FR, S32RL and S32RR to produce medium-to-high range audio signals SHFL, SHC, SHFR, SHRL and SHRR and supply them to the satellite speakers 3FL, 3C, 3FR, 3RL and 3RR to have them output highly directional medium-to-high sounds.

On the other hand, the low pass filters 12FL, 12C, 12FR, 12RL and 12RR are adapted to extract medium-to-low range components of frequencies lower than the cutoff frequencies fc from the respective audio signals S30FL, S30C, S30FR, S30RL and S30RR to produce medium-to-low range audio signals S33FL, S33C, S33FR, S33RL and S33RR, which are then sequentially added by adders 33A, 33B, 33C and 33D to produce medium-to-low range audio signal S34, which audio signal is then supplied to an adder 34.

The adder 34 adds the low-frequency channel audio signal S30LFE and the medium-to-low range audio signal S34 to produce medium-to-low range audio signal S34A and supplies it to the contribution to sound image reducing section 15.

Thus, the audio signal S34A is obtained by adding the low-frequency channel audio signal S30LFE obtained in advance by extracting low-frequency components and medium-to-low range components of the audio signals S30FL, S30C, S30FR, S30RL and S30RR.

Like the audio amplifier 2 (FIG. 2), the contribution to sound image reducing section 15 reduces the correlation of the audio signals S32FL, S32C, S32FR, S32RL and S32RR and the audio signal S34A by means of the correlation reducing filter 16 to produce correlation reducing audio signal S35 and then delays the produced correlation reducing audio signal by about 5 ms by means of the delay circuit 17 to produce a correlation reducing delayed audio signal S36, which is then supplied to amplifier circuit 18.

Like the audio amplifier 2 (FIG. 2), the amplifier circuit 18 amplifies the correlation reducing delayed audio signal S36 supplied from the delay circuit 17 to produce medium-to-low range audio signal SLFE and supplies it to the subwoofer 4. Thus, medium-to-low sounds whose correlation with the medium-to-high sounds output from the satellite speakers 3FL, 3C, 3FR, 3RL and 3RR is reduced and that are slightly delayed from the medium-to-high sounds are then output from the subwoofer 4.

In this way, like the audio amplifier 2, the audio amplifier 31 is adapted to generate medium-to-low range audio signal SLFE, whose correlation with the medium-to-high range audio signals SHFL, SHC, SHFR, SHRL and SHRR is reduced and whose influence on the sound image is also reduced as a result of being slightly delayed, by means of the correlation reducing filter 16 and the delay circuit 17 of the contribution to sound image reducing section 15.

Thus, as a result, like the audio amplifier 2, the audio amplifier 31 can output highly directional medium-to-high sounds from the satellite speakers 3FL, 3C, 3FR, 3RL and 3RR and also output medium-to-low range sounds that are directional to some extent and delayed and whose correlation with the medium-to-high sounds is reduced from the subwoofer 4 on the basis of the audio signals S30FL, S30C, S30FR, S30RL and S30RR supplied to it.

Then, like the audio system 1 (FIG. 1), the audio system 30 can properly localize a sound image by means of the highly directional medium-to-high sounds output from the satellite speakers 3FL, 3C, 3FR, 3RL and 3RR and compensate the medium-to-low range below the crossover frequency without disturbing the sound image with the medium-to-low sounds output from the subwoofer 4 so that it can properly localize a sound image as a whole and have the listener 100 listen to audio sounds with good frequency characteristics.

(2-3) Audio Signal Processing Sequence

Figure 12:
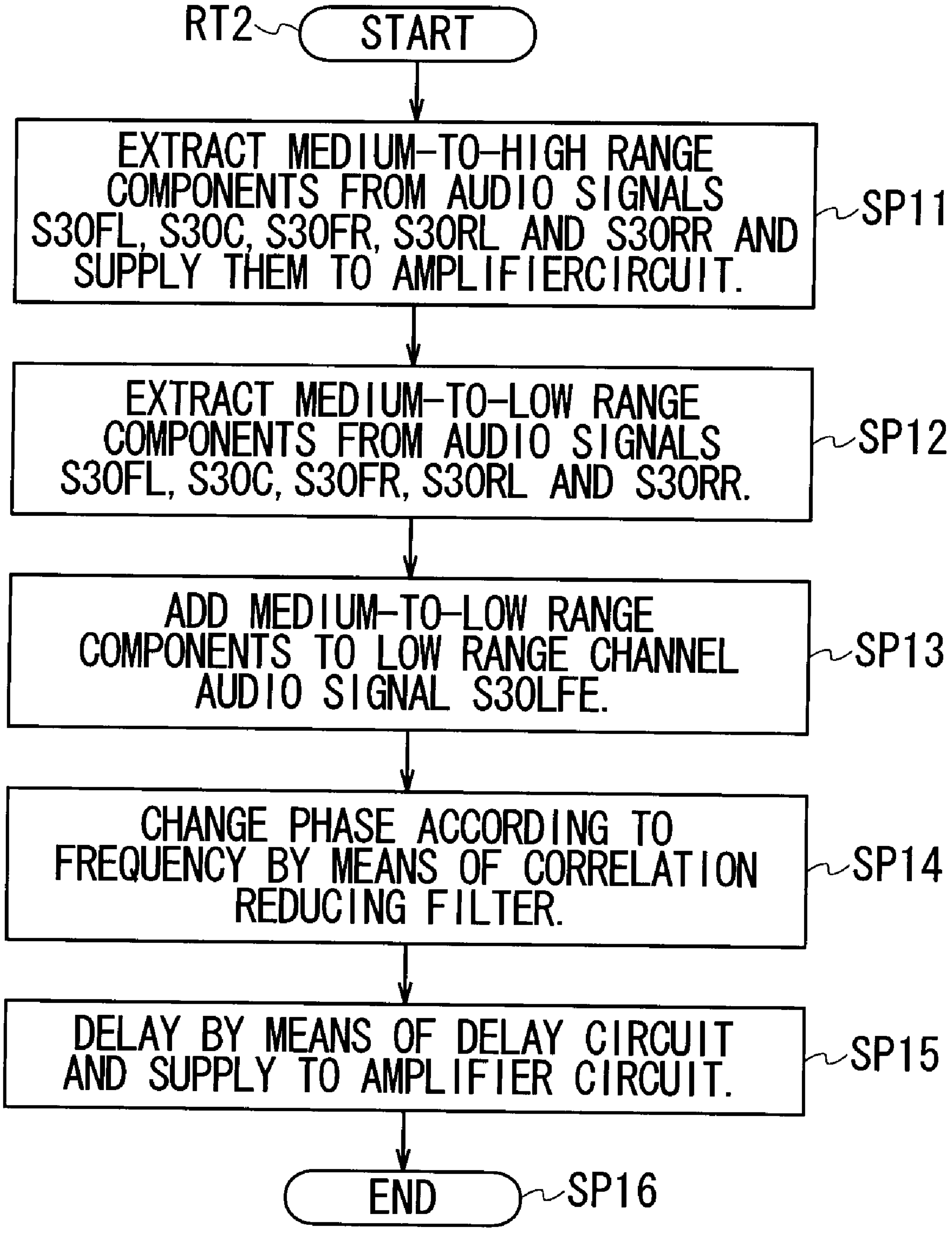
FIG. 12 is a flowchart of the audio signal processing sequence of the second embodiment.

Now, the audio signal processing sequence RT2 to be followed by the DSP 32 of the audio amplifier 31 when it generates medium-to-high range audio signals SHFL, SHC, SHFR, SHRL and SHRR and medium-to-low range audio signal SLFE from audio signals S30FL, S30C, S30FR, S30RL, S30RR and S30LFE will be described below by referring to the flowchart of FIG. 12, which corresponds to FIG. 8.

As the audio amplifier 31 is energized from the power sensor and the DSP 32 of the audio amplifier 31 executes the audio signal processing program, it starts the audio signal processing sequence RT2 and then moves to Step SP11. In Step SP11, the DSP 32 extracts the medium-to-high range components from the audio signals S30FL, S30C, S30FR, S30RL and S30RR by means of the high pass filters 11FL, 11C, 11FR, 11RL and 11RR to generate audio signals S32FL, S32C, S32FR, S32RL and S32RR and supplies these signals respectively to the amplifier circuits 13FL, 13C, 13FR, 13RL and 13RR before it moves to the next step, or Step SP12.

The amplifier circuits 13FL, 13C, 13FR, 13RL and 13RR respectively generate medium-to-high range audio signals SHFL, SHC, SHFR, SHRL and SHRR by amplifying the audio signals S32FL, S32C, S32FR, S32RL and S32RR.

In Step SP12, the DSP 32 extracts medium-to-low range components from the audio signals S30FL, S30C, S30FR, S30RL and S30RR respectively by means of the low pass filters 12FL, 12C, 12FR, 12RL and 12RR to produce audio signals S33FL, S33C, S33FR, S33RL and S33RR and moves to the next step, or Step SP13.

In Step SP13, the DSP 32 generates audio signal S34A by adding the audio signals S33FL, S33C, S33FR, S33RL and S33RR to the low-frequency channel audio signal S30LFE by means of the adders 33A through 33D and the adder 34 and then moves to the next step, or Step SP14.

In Step SP14, the DSP 32 generates correlation reducing audio signal S35 for reducing the correlation relative to the audio signals S32FL, S32C, S32FR, S32RL and S32RR by changing the phase of the audio signal S34A according to the frequency by means of the correlation reducing filter 16 of the contribution to sound image reducing section 15 and then moves to the next step, or Step SP15.

In Step SP15, the DSP 32 generates a correlation reducing delayed audio signal S36 that is slightly delayed from the correlation reducing audio signal S35 by means of the delay circuit 17 of the contribution to sound image reducing section 15 and then moves to Step SP16, where it ends the audio signal processing sequence RT2.

Note that, at this time, the amplifier circuit 18 generates the medium-to-low range audio signal SLFE by amplifying the correlation reducing delayed audio signal S36.

Then, like the DSP 10, the DSP 32 executes the audio signal processing sequence RT2 at each predetermined clock time and successively generates medium-to-high range audio signals SHFL, SHC, SHFR, SHRL and SHRR and medium-to-low range audio signal SLFE from the audio signals S30FL, S30C, S30FR, S30RL and S30RR that are supplied successively.

(2-4) Operation and Advantages

With the above-described arrangement, like the audio amplifier 2 (FIG. 2), the audio amplifier 31 (FIG. 11) generates medium-to-high range audio signals S32FL, S32C, S32FR, S32RL and S32RR by mainly extracting medium-to-high range components from audio signals S30FL, S30C, S30FR, S30RL and S30RR by means of the high pass filters 11FL, 11C, 11FR, 11RL and 11RR and amplifies them respectively by means of the amplifier circuits 13FL, 13C, 13FR, 13RL and 13RR to produce medium-to-high range audio signals SHFL, SHC, SHFR, SHRL and SHRR, which are then supplied to the satellite speakers 3FL, 3C, 3FR, 3RL and 3RR.

Additionally, the audio amplifier 31 generates medium-to-low range audio signals S33FL, S33C, S33FR, S33RL and S33RR by mainly extracting medium-to-low range components from the audio signals S30FL, S30C, S30FR, S30RL and S30RR by means of low pass filters 12FL, 12C, 12FR, 12RL and 12RR and adds them to the low-frequency channel audio signal S30LFE by means of the adders 33A through 33D and the adder 34 to produce audio signal S34A.

Subsequently, the audio amplifier 31 reduces the correlation of the audio signal S34A relative to the audio signals S32FL, S32C, S32FR, S32RL and S33RR by changing the phase according to the frequency by means of the correlation reducing filter 16 of the contribution to sound image reducing section 15. Then, it slightly delays the audio signal to generate correlation reducing delayed audio signal S36 by means of the delay circuit 17 and amplifies it by means of the amplifier circuit 18 so as to supply it as medium-to-low range audio signal SLFE to the subwoofer 4.

As a result, in the audio system 30, the highly directional medium-to-high sounds output from the satellite speakers 3FL, 3C, 3FR, 3RL and 3RR properly localize the sound image and, at the same time, the medium-to-low sounds output from the subwoofer 4 compensate the medium-to-low ranges without disturbing the sound image.

In the audio system 30, since the correlation reducing filter 16 of the contribution to sound image reducing section 15 reduces the correlation of audio signal S34A relative to the audio signals S32FL, S32C, S32FR, S32RL and S32RR, while maintaining the sound pressure level and the frequency characteristics of the audio signal S34A, it is possible to reduce the influence of the audio sounds output from the subwoofer 4 on the sound image formed by the audio sounds from the satellite speakers 3FL, 3C, 3FR, 3RL and 3RR.

Additionally, in the audio system 30, the delay circuit 17 of the contribution to sound image reducing section 15 delays the correlation reducing audio signal S5 by about 5 ms so that the audio sounds output from the satellite speakers 3FL, 3C, 3FR, 3RL and 3RR get to the ears of the listener 100 before the audio sounds output from the subwoofer 4. Thus, it is possible to make the listener 100 perceive the position of the sound source as located near the satellite speakers 3FL, 3C, 3FR, 3RL and 3RR due to the so-called precedence effect (Haas effect).

Thus, as a result, with the audio system 30, a sound image is properly localized and the listener 100 can listen to audio sounds showing excellent frequency characteristics by means of the downsized satellite speakers 3FL, 3C, 3FR, 3RL and 3RR and the subwoofer 4.

Thus, with the above-described arrangement, the audio system 30 outputs highly directional medium-to-high sounds, for which the crossover frequency is elevated, from the downsized satellite speakers 3FL, 3C, 3FR, 3RL and 3RR and, at the same time, medium-to-low sounds whose frequency components are maintained but contribution to the sound image is reduced by reducing the correlation of audio signal S34A for medium-to-low sounds, which are directional to some extent, relative to the medium-to-high sounds by means of the correlation reducing filter 16 and slightly delaying them relative to the medium-to-high sounds by means the delay circuit 17 from the subwoofer 4. Then, the sound image formed by the audio sounds output from the satellite speakers 3FL, 3C, 3FR, 3RL and 3RR is not disturbed by the audio sounds output from the subwoofer 4 so that it is possible to raise the degree of freedom for the positions of installation of the satellite speakers and make the listener 100 to listen to audio sounds by which a sound image is properly localized and which shows excellent frequency characteristics.

(3) Other Embodiments

While a plurality of satellite speakers, two and five more specifically, are used respectively for the above-described first and second embodiments, the present invention is by no means limited thereto and can be applied to an arrangement for using a single satellite speaker. Then, medium-to-high range audio signals are reproduced by the satellite speaker, while medium-to-low range audio signals are reproduced by a subwoofer. With this arrangement, since the correlation of the medium-to-high range audio signals and the medium-to-low range audio signals is reduced so that the sound image formed by them is localized near the satellite speaker.

Further, in the above-described first embodiment, the correlation reducing filter 16 of the contribution to sound image reducing section 15 changes the phase of the medium-to-low range audio signal S4 to reduce the correlation of the medium-to-high range audio signals S2L and S2R. However, the present invention is not limited thereto. The correlation of the medium-to-low range audio signals S4 may be reduced by changing the phase of the medium-to-high range audio signals S2L and S2R. The same applies to the second embodiment.

Figure 13:
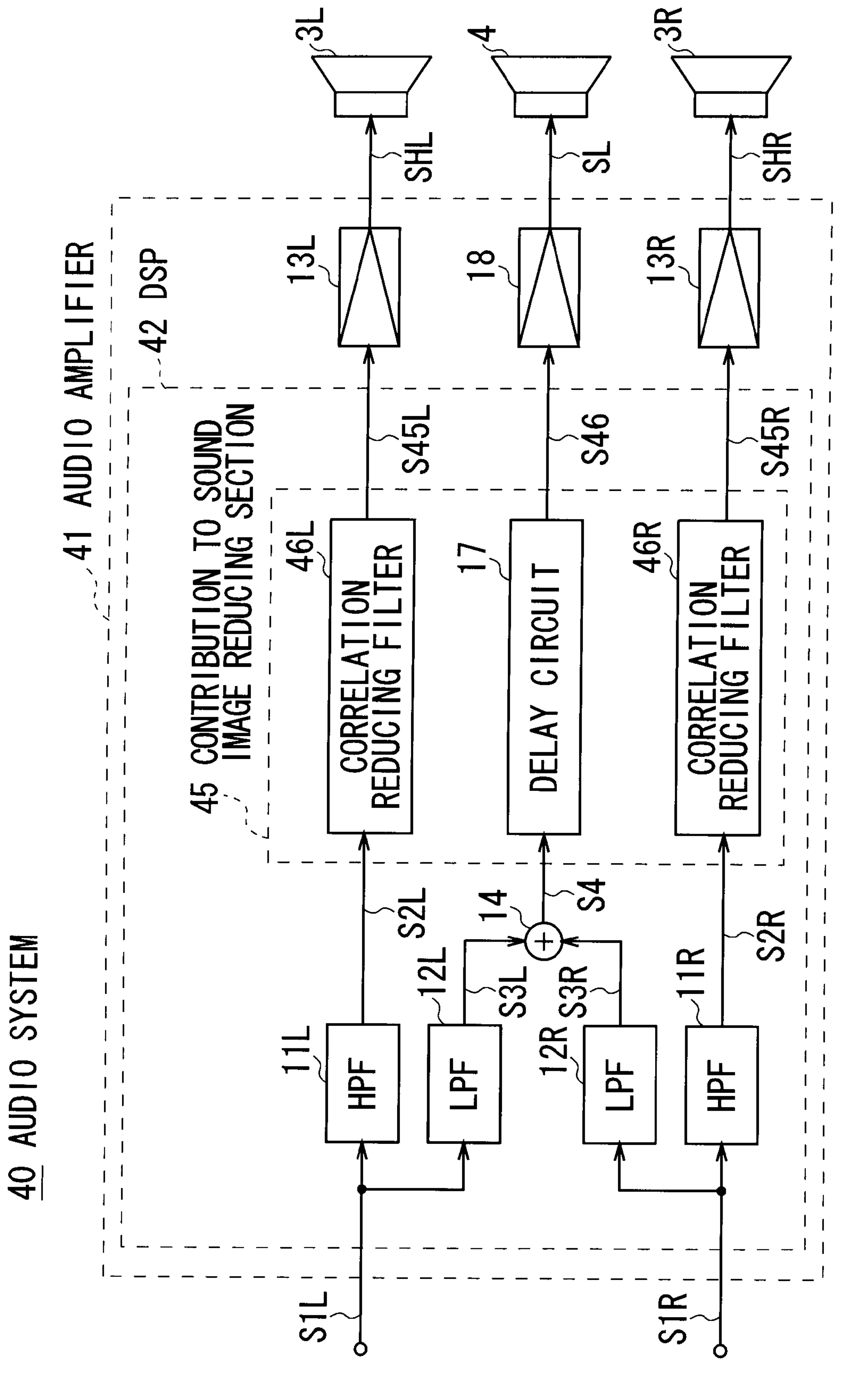
FIG. 13 is a schematic block diagram of an audio amplifier realized by applying another embodiment of the present invention, illustrating the circuit configuration thereof.

For example, referring to FIG. 13 where the components corresponding to those of FIG. 2 are denoted respectively by the same reference symbols, the DSP 42 of the audio amplifier 41 generates correlation reducing audio signals S45L and S45R by reducing the correlation of medium-to-low range audio signal S4 relative to medium-to-high range audio signals S2L and S2R by means of the correlation reducing filters 46L and 46R of the contribution to sound image reducing section 45 and amplifies them respectively by means of the amplifier circuits 13L and 13R to produce medium-to-high range audio signals SHL and SHR, which are then supplied to the satellite speakers 3L and 3R.

Note that the correlation reducing filters 46L and 46R are adapted to change the phase according to the frequencies to produce the same phase and the same frequency characteristics as shown in the FIG. 5 so as to maintain the correlation between the left and right correlation reducing audio signals S45L and S45R.

The DSP 42 of the audio amplifier 41 generates delayed audio signal S46 by delaying the medium-to-low audio signal S4 by means of the delay circuit 17 of the contribution to sound image reducing section 45, amplifies it by means of the amplifier circuit 18 to produce medium-to-low range audio signal SL and supplies it to the subwoofer 4.

Then, as a result, the audio system 40 can reduce the correlation of the medium-to-high sounds output from the satellite speakers 3L and 3R and the medium-to-low sounds output from the subwoofer 4, while maintaining the correlation of the medium-to-high sounds output from the satellite speaker 3L and those output from the satellite speaker 3R. Then, like the audio system 1 (FIG. 1), the audio system 40 can make the listener 100 listen to audio sounds with excellent frequency characteristics whose sound image is properly localized by delaying the medium-to-low sounds output from the subwoofer 4 relative to the medium-to-high sounds output from the satellite speakers 3L and 3R.

Figure 14A:
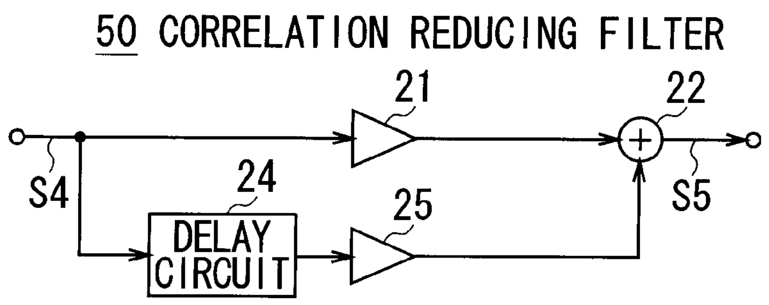
FIGS. 14A to 14C are schematic block diagrams of correlation reducing filters according to the another embodiment of the present invention, illustrating the configuration thereof.
Figure 14B:
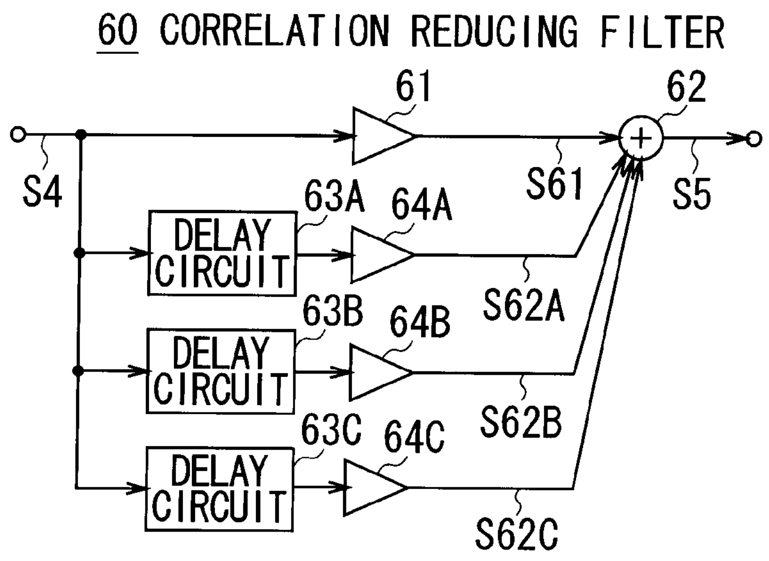
Figure 14C:
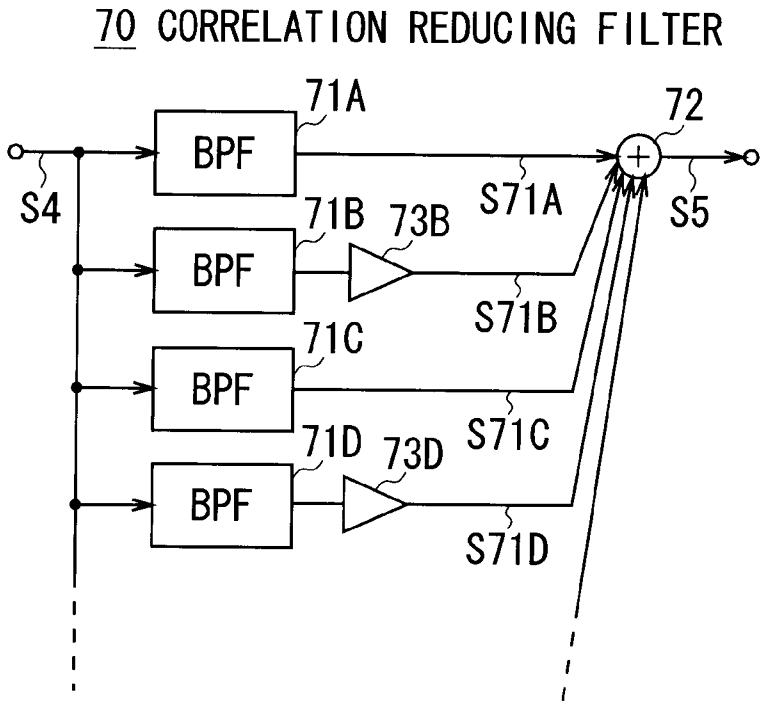

While a correlation reducing filter 16 having a circuit configuration as shown in FIG. 4 is used for the above-described first and second embodiments in order to reduce the correlation of the medium-to-high sounds output from the satellite speakers 3L and 3R and the medium-to-low sounds output from the subwoofer 4, the present invention is by no means limited thereto and any of various correlation reducing filters 50, 60 and 70 having circuit configurations as shown in FIGS. 14A, 14B and 14C may alternatively be used.

The correlation reducing filter 50 (FIG. 14A) is devoid of the amplifier 26 and the adder 23 of the correlation reducing filter 16 (FIG. 4) so that it is not provided with feedback.

Thus, the correlation reducing filter 50 changes the sound pressure level of the correlation reducing audio signal S5 relative to the input audio signal S4 so that it can degrade the sound quality while it provides advantages similar to those of the correlation reducing filter 16 and can alleviate the processing load of the DSP 10 if compared with the correlation reducing filter 16.

The correlation reducing filter 60 (FIG. 14B) is formed to operate as a so-called FIR (finite impulse response) filter and adapted to generate a correlation reducing audio signal S5 by adding signal S61, which is obtained by amplifying the input audio signal S4, and signals S62A through S62C, which are obtained by delaying the input audio signal S4 by means of a plurality of delay circuits 63A through 63C and amplifying the signals output from the delay circuits respectively by amplifiers 64A through 64C, by means of an adder 62.

Thus, the correlation reducing filter 60 can linearly change the phase relative to the logarithm of the frequency so that, like the correlation reducing filter 16, it can change only the phase without changing the sound pressure level and also change the phase relative to the frequency, or the frequency-phase characteristics as shown in FIG. 5, by changing the extent of delay at the delay circuits 63A through 63C, although it increases the processing load of the DSP 10.

The correlation reducing filter 70 (FIG. 14C) is adapted to generate correlation reducing audio signal S5 by adding signals S71A, S71B, S71C, S71D, . . . , which are obtained by dividing the input audio signal S4 by means of a plurality of band pass filters (BPFs) 71A, 71B, 71C, 71D, . . . and processing them in various different ways from band to band such as allowing some of the signal to pass and inverting some of the signals by means of respective inverters 73B and 73D.

Thus, the correlation reducing filter 70 changes the mode of changing the phase from frequency band to frequency band to consequently provide advantages similar to those of the correlation reducing filter 16, although it slightly increases the processing load of the DSP 10 if compared with the correlation reducing filter 16.

While the present invention is applied to a 2.1-channel audio system 1 and a 5.1-channel audio system 30 in the above-described embodiments, the present invention is by no means limited thereto and can also be applied to a variety of different audio systems such as 4.1-channel audio systems and 7.2-channel audio systems that are formed by combining a plurality of satellite speakers 3 and one or more than subwoofers 4, although the number of satellite speakers and that of subwoofers may vary.

Particularly, when a plurality of subwoofers 4 is used, all the medium-to-low range components of the supplied audio signal may be added and evenly allocated among them in a manner as described above or alternatively, when the locations of the subwoofers are roughly defined, the components may be allocated to the subwoofers 4 in such a way that medium-to-low sounds that correspond to the medium-to-high sounds output from one of the satellite speakers 3 are output from a subwoofer 4 located near the satellite speaker 3.

While the crossover frequency is defined to be about 650 Hz in the audio systems 1 and 30 described above for the embodiments, the present invention is by no means limited thereto and the crossover frequency may alternatively be defined as a value selected from the range between about 150 Hz and about 1 k Hz by considering the offset to the size and the volume of the satellite speakers 3.

While the delay circuit 17 is adapted to produce a delay time of 5 ms for the above-described embodiments, the present invention is by no means limited thereto and the delay time may be selected from the range between about 1 ms and about 30 ms by which the precedence effect can be obtained.

While a ROM (not shown) is used to store the audio signal processing program that the DSP 10 or the DSP 32 executes for each of the above-described embodiments, the present invention is by no means limited thereto and it may alternatively be so arranged that the audio signal processing program is read out from a removable memory medium such as a Compact Disc-Read Only Memory (CD-ROM) medium or "MEMORY STICK (Registered trademark of Sony Corporation)" and executed directly or after installing it in a non-volatile memory (not shown). Still alternatively, the audio signal processing program may be acquired by wired communication by way of a Universal Serial Bus (USB) (not shown) or by wireless communication by way of a wireless LAN conforming to the Institute of Electrical and Electronics Engineers (IEEE) 802.11a/b/g Standard and executed.

The circuit configuration of the audio amplifiers 2 and that of the audio amplifier 31 (FIGS. 2 and 11) are functionally realized by software as the DSP 10 and the DSP 32 respectively execute the audio signal processing programs, following the audio signal processing sequences RT1 and RT2, in the above description of the embodiments, the present invention is by no means limited thereto and the circuit configuration of the audio amplifier 2 and that of the audio amplifier 31 may alternatively be realized by means of hardware or a combination of a functional circuit configuration formed by using software and a functional circuit configuration formed by using hardware.

While the present invention is applied to a multi-channel audio amplifier 2 and a multi-channel audio amplifier 31 for the above-described embodiments, the present invention is by no means limited thereto and the present invention can also be applied to a signal processing apparatus adapted to execute the function of the DSP 10 or the DSP 32 and to various electronic apparatus that can execute audio signal processes such as television sets adapted to receive broadcast waves containing multi-channel sounds and reproduce the audio sounds.

The audio amplifier 2 that operates as audio signal processing apparatus is formed by high pass filters 11L and 11R that are high-frequency components extraction units, low pass filters 12L and 12R that are low-frequency components extraction units, an adder 14 that is a low-frequency signal generation unit, a correlation reducing filter 16 that is a correlation reducing unit and a delay circuit 17 that is a delay unit for the above-described embodiments, the present invention is by no means limited thereto and the audio amplifier 2 may alternatively formed by a high-frequency component extraction unit, a low-frequency component extraction unit, a low-frequency signal generation unit, a correlation reducing unit and a delay unit, which may show various circuit configurations.

The present invention can be utilized in various audio systems realized by combining a plurality of satellite speakers and one or more than one subwoofers.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing apparatus comprising:

a high-frequency components extraction unit configured to extract high-frequency components higher than a predetermined cutoff frequency from an input audio signal and to supply the high-frequency components to satellite speakers by way of a predetermined high frequency range amplifier;

a low-frequency components extraction unit configured to extract low-frequency components lower than the predetermined cutoff frequency from the input audio signal;

a correlation reducing unit configured to reduce the correlation of the low-frequency components relative to the high-frequency components of the input audio signal; and a delay unit configured to delay the correlation-reduced low-frequency components and to supply the delayed correlation-reduced low-frequency components to a subwoofer by way of a predetermined low frequency range amplifier.

2. The audio signal processing apparatus according to claim 1, wherein the input audio signal includes multi-channel audio signals supplied from a predetermined sound source, the high-frequency components extraction unit includes a plurality of high-frequency components extraction sub-units configured to extract high-frequency components respectively from channels of the multi-channel audio signals, the low-frequency components extraction unit includes a plurality of low-frequency components extraction sub-units configured to extract low-frequency components respectively from the channels of the multi-channel audio signals, and the apparatus further includes a low-frequency signal generation unit configured to generate a low-frequency signal by adding the low-frequency components from the plurality of low-frequency components extraction sub-units and to supply the low-frequency signal to the correlation reducing unit.

3. The audio signal processing apparatus according to claim 1, wherein the predetermined cutoff frequency is higher than the frequency band at which a listener feels directivity of audio sounds.

4. The audio signal processing apparatus according to claim 2, wherein the predetermined cutoff frequency is about 650 Hz.

5. The audio signal processing apparatus according to claim 1, wherein the correlation reducing unit reduces the correlation of the low-frequency components relative to the high-frequency components by changing a phase of the low-frequency components for each frequency.

6. The audio signal processing apparatus according to claim 2, wherein the correlation reducing unit reduces the correlation of the low-frequency components relative to the high-frequency components of the multi-channel audio signals by changing phases of the low-frequency components of the multi-channel audio signals for each frequency.

7. The audio signal processing apparatus according to claim 6, wherein the correlation reducing unit is an all pass filter that does not change a sound pressure level of the low-frequency components when changing phase of the low-frequency components for each frequency.

8. The audio signal processing apparatus according to claim 2, wherein:

the predetermined sound source supplies a low-frequency channel audio signal containing only sounds of the low-frequency components in addition to the multi-channel audio signals;

the high-frequency components extraction unit extracts the high-frequency components above the predetermined cutoff frequency from the multi-channel audio signals except the low-frequency channel audio signal and respectively supplies the high-frequency components to the satellite speakers by way of the predetermined high frequency range amplifier;

the low-frequency components extraction unit extracts the low-frequency components below the predetermined cutoff frequency from the multi-channel audio signals except the low-frequency channel audio signal; and the low-frequency signal generation unit generates a low-frequency signal by adding the low-frequency components to the low-frequency channel audio signal.

9. The audio signal processing apparatus according to claim 1, further comprising:

a low-frequency component adder configured to combine the low-frequency components to generate a combined low-frequency signal, wherein the correlation reducing unit further includes an infinite impulse response filter that takes as input the combined low-frequency signal and outputs a correlation-reduced signal, and wherein the infinite impulse response filter includes:

a first adder configured to take as input the combined low-frequency signal and the correlation-reduced signal that has passed through a first amplifier; and a second adder configured to take as input the combined low-frequency signal that has passed through a second amplifier and the output of the first adder that has been delayed and passed through a third amplifier, the second adder configured to output the correlation-reduced signal.

10. An audio signal processing method comprising:

extracting high-frequency components higher than a predetermined cutoff frequency from an input audio signal and supplying the high-frequency components to satellite speakers by way of a predetermined high frequency range amplifier;

extracting low-frequency components lower than the predetermined cutoff frequency from the input audio signal;

reducing the correlation of the low-frequency components relative to the high-frequency components of the input audio signal; and delaying the correlation-reduced low-frequency components and supplying the delayed correlation-reduced low-frequency components to a subwoofer by way of a predetermined low frequency range amplifier.

11. A non-transitory computer readable storage medium storing computer readable instructions thereon which, when executed by a computer, cause the computer to perform an audio signal processing method comprising:

extracting high-frequency components higher than a predetermined cutoff frequency from an input audio signal and supplying the high-frequency components to satellite speakers by way of a predetermined high frequency range amplifier;

extracting low-frequency components lower than the predetermined cutoff frequency from the input audio signal;

reducing the correlation of the low-frequency components relative to the high-frequency components of the input audio signal; and delaying the correlation-reduced low-frequency components and supplying the delayed correlation-reduced low-frequency components to a subwoofer by way of a predetermined low frequency range amplifier.

12. An audio signal processing apparatus comprising:

means for extracting high-frequency components higher than a predetermined cutoff frequency from an input audio signal and supplying the high-frequency components to satellite speakers by way of a predetermined high frequency range amplifier;

means for extracting low-frequency components lower than the predetermined cutoff frequency from the input audio signal;

means for reducing the correlation of the low-frequency components relative to the high-frequency components of the input audio signal; and means for delaying the correlation-reduced low-frequency components and supplying the delayed correlation-reduced low-frequency components to a subwoofer by way of a predetermined low frequency range amplifier.

* * * * *